US012635446B2

(12) United States Patent
Kiyohara

(10) Patent No.: US 12,635,446 B2
(45) Date of Patent: May 19, 2026

(54) SUBSTRATE PROCESSING APPARATUS AND SUBSTRATE PROCESSING METHOD

(71) Applicant: Tokyo Electron Limited, Tokyo (JP)

(72) Inventor: Yasuo Kiyohara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 393 days.

(21) Appl. No.: 18/106,753

(22) Filed: Feb. 7, 2023

(65) Prior Publication Data

US 2023/0260807 A1      Aug. 17, 2023

(30) Foreign Application Priority Data

Feb. 16, 2022     (JP) ................................. 2022-022438

(51) Int. Cl.
H10P 72/00         (2026.01)
H10P 72/30         (2026.01)
(52) U.S. Cl.
CPC ...... H10P 72/0408 (2026.01); H10P 72/0462 (2026.01); H10P 72/3302 (2026.01)
(58) Field of Classification Search
CPC ........... H01L 21/67034; H01L 21/6719; H01L 21/67742
USPC ...................................................... 134/56 R
See application file for complete search history.

(56) References Cited

U.S. PATENT DOCUMENTS

2019/0148182 A1* 5/2019 Yamada ............ H01L 21/67051
                                                                   134/37
2020/0312678 A1* 10/2020 Morikawa ......... H01L 21/67173

FOREIGN PATENT DOCUMENTS

| JP | 2011192835 A | 9/2011 |
|----|--------------|--------|
| JP | 2013206957 A | 10/2013 |
| JP | 2019-091772 A | 6/2019 |
| KR | 20170137245 A | 12/2017 |
| WO | 2021033588 A1 | 2/2021 |

* cited by examiner

*Primary Examiner* — Tinsae B Ayalew
(74) *Attorney, Agent, or Firm* — Venjuris, P.C.

(57) ABSTRACT

A substrate processing apparatus includes: a processing container including an internal space where a supercritical drying process is performed on a substrate having a surface to which a liquid is attached, by using a processing fluid in a supercritical state; a housing including a processing region where the processing container is disposed, and a carry-in/out region where carry-in/out of the substrate is performed; a delivery section that is provided in the carry-in/out region to deliver the substrate to/from a substrate transfer arm entering the carry-in/out region from an outside of the housing; a substrate transfer section that transfers the substrate between the delivery section and the processing container; and a gas supply provided in the carry-in/out region to supply a dry gas to the processing container.

12 Claims, 10 Drawing Sheets

*FIG. 2*

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2022-022438, filed on Feb. 16, 2022, with the Japan Patent Office, the disclosure of which is incorporated herein in its entirety by reference.

TECHNICAL FIELD

The present disclosure relates to a substrate processing apparatus and a substrate processing method.

BACKGROUND

In manufacturing the semiconductor device by forming a stacked structure of integrated circuits on the surface of a substrate such as a semiconductor wafer, a liquid processing such as a chemical liquid cleaning or a wet etching is performed. In order to more reliably prevent a collapse of patterns which have become more and more fine in recent years, a drying method using a processing fluid in a supercritical state has been recently used during a drying process which is a final step of the liquid processing (see, e.g., Japanese Patent Laid-Open Publication No. 2019-091772).

SUMMARY

According to an embodiment of the present disclosure, a substrate processing apparatus includes: a processing container including an internal space where a supercritical drying process is performed on a substrate having a surface to which a liquid is attached, by using a processing fluid in a supercritical state; a housing including a processing region where the processing container is disposed, and a carry-in/out region where carry-in/out of the substrate is performed; a delivery section that is provided in the carry-in/out region to deliver the substrate to/from a substrate transfer arm entering the carry-in/out region from an outside of the housing; a substrate transfer section that transfers the substrate between the delivery section and the processing container; and a gas supply provided in the carry-in/out region to supply a dry gas to the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 2 is a vertical cross-sectional view illustrating a configuration of a supercritical drying unit provided in the substrate processing system of FIG. 1.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, a configuration of a substrate processing system 1 according to an embodiment of a substrate processing apparatus will be described briefly with reference to FIG. 1. In order to simplify the description, an XYZ orthogonal coordinate system (see the lower left of FIG. 1) is set and will be referred to as appropriate.

Figure 1:
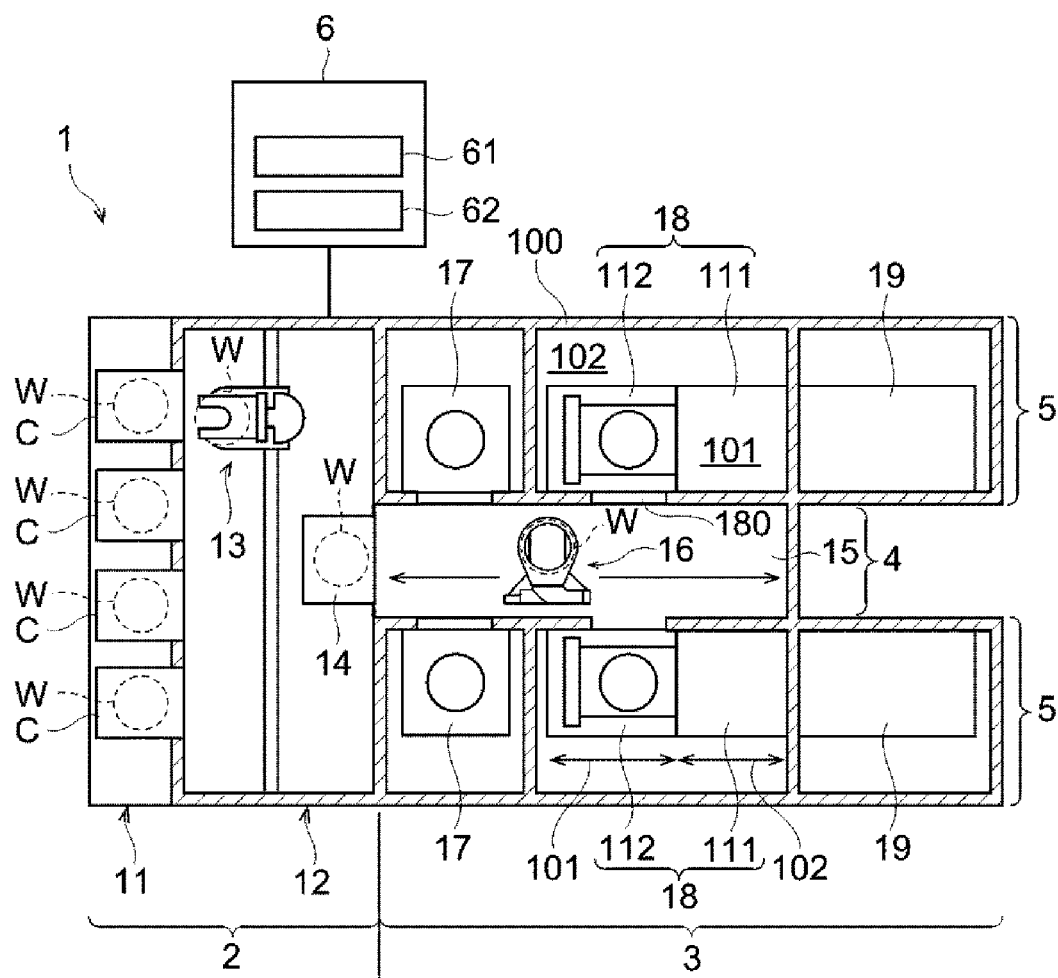
FIG. 1 is a schematic horizontal cross-sectional view of a substrate processing system according to an embodiment of a substrate processing apparatus.
Figure 1:
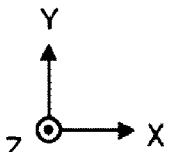

As illustrated in FIG. 1, the substrate processing system 1 includes a carry-in/out station 2 and a processing station 3.

The carry-in/out station 2 includes a load port 11 and a transfer block 12. A plurality of carriers C is placed on the load port 11. Each carrier C accommodates a plurality of substrates W (e.g., semiconductor wafers) in a horizontal posture at vertical intervals.

In the transfer block 12, a transfer device 13 and a delivery unit 14 are provided. The delivery unit 14 includes an unprocessed substrate placing unit that temporarily places thereon one or a plurality of unprocessed substrates W (substrates W before being processed in the processing station 3), and a processed substrate placing unit that temporarily places thereon one or a plurality of processed substrates W (substrates W processed in the processing station 3). The transfer device 13 may transfer the substrate W between any of the carriers C placed on the load port 11 and the delivery unit 14.

The processing station 3 includes a transfer block 4 and a pair of processing blocks 5 provided on both sides of the transfer block 4 in the Y direction. Each processing block 5 is provided with a liquid processing unit 17, a supercritical drying unit 18, and a processing fluid supply cabinet 19. In this embodiment, the liquid processing unit 17 and the supercritical drying unit 18 are each a single wafer processing unit.

The liquid processing unit 17 is a rotary liquid processing unit known in the technical field of the manufacturing of semiconductor devices, and includes a spin chuck and a plurality of nozzles (both are not illustrated). The spin chuck holds the substrate W in the horizontal posture, and rotates the substrate W around the vertical axis. The nozzles supply various processing fluids necessary for the liquid processing of the substrate W, to the substrate W that is being rotated while being held on the spin chuck. The supercritical drying unit 18 will be described later. A processing fluid necessary for the processing is supplied from the processing fluid supply cabinet 19 to the liquid processing unit 17 and the supercritical drying unit 18.

The transfer block 4 includes a transfer region 15 and a transfer device 16 disposed in the transfer region 15. The transfer device 16 may transfer the substrate W among the delivery unit 14, any of the liquid processing units 17, and any of the supercritical drying units 18.

Each processing block 5 may have a multi-tier (e.g., three-tier) structure. In this case, one liquid processing unit 17, one supercritical drying unit 18, and one processing fluid supply cabinet 19 are provided on each stage. In this case, one transfer device 16 may be accessible to the liquid processing units 17 and the supercritical drying units 18 on all of the stages.

The substrate processing system 1 includes a control device 6. The control device 6 is, for example, a computer, and includes an arithmetic processing unit 61 and a storage unit 62. The arithmetic processing unit 61 includes a micro-computer provided with, for example, a central processing unit (CPU), a read only memory (ROM), a random access memory (RAM), and input/output ports, or various circuits. The CPU of the microcomputer reads out and executes a program stored in the ROM, thereby implementing the control of, for example, the transfer devices 13 and 16, the liquid processing unit 17, the supercritical drying unit 18, and the processing fluid supply cabinet 19. This program may be recorded in a computer-readable recording medium, and may be installed from the recording medium into the storage unit 62 of the control device 6. Examples of the computer-readable recording medium include a hard disk (HD), a flexible disk (PD), a compact disk (CD), a magnet optical disk (MO), and a memory card. The storage unit 62 is implemented by, for example, a semiconductor memory device such as a RAM or a flash memory, or a storage device such as a hard disk or an optical disk.

Next, the transfer flow of the substrate W in the substrate processing system 1 described above will be described briefly.

An external transfer robot (not illustrated) places a carrier C that accommodates unprocessed substrates W, on the load port 11. The transfer device 13 takes out one of the substrates W from the carrier C, and carries the substrate W into the transfer unit 14. The transfer device 16 takes out the substrate W from the transfer unit 14, and carries the substrate W into the liquid processing unit 17.

In the liquid processing unit 17, a liquid processing including a plurality of steps is performed. In a non-limiting embodiment, the liquid processing includes at least one chemical liquid processing step, at least one rinsing step, and an IPA replacement step. In the chemical liquid processing step, a chemical liquid for a cleaning or a wet etching is supplied from the nozzles to the substrate W that is being rotated by the spin chuck. In the rinsing step, a rinsing liquid (e.g., deionized water (DIW)) is supplied from the nozzles to the substrate W that is being rotated by the spin chuck, so that the chemical liquid and a reaction product which remain on the surface of the substrate W are washed away. In the IPA replacement step, isopropyl alcohol (IPA) is supplied from the nozzles to the substrate W that is being rotated by the spin chuck, so that the rinsing liquid on the surface of the substrate W (including the surfaces of recesses of patterns) is replaced with the IPA. Then, in a state where the IPA is being supplied from the nozzles, the rotation speed of the substrate is reduced to a very low speed to adjust the film thickness of IPA. Then, the supply of the IPA is stopped, and the rotation of the substrate W is also stopped. As a result, the surface of the substrate W is covered with an IPA liquid film (IPA puddle) having a desired film thickness. As long as the surface of the substrate W (including the surfaces of recesses of patterns) is eventually covered with the IPA liquid film having the desired film thickness, the previous processing steps are arbitrary.

Next, the substrate W with the IPA puddle formed on its surface is taken out from the liquid processing unit 17 by the transfer device 16, and is carried into the supercritical drying unit 18. In the supercritical drying unit 18, the substrate W is dried according to the procedure described below using a supercritical drying technique. The supercritical drying technique may be effectively used for drying a substrate on which a fine pattern with a high aspect ratio is formed, because a surface tension which may cause the collapse of patterns does not act on patterns. Then, the transfer device 16 takes out the dried substrate W from the supercritical drying unit 18, and carries the substrate W into the delivery unit 14. The transfer device 13 takes out the substrate W from the delivery unit 14, and accommodates the substrate W in its own carrier C placed on the load port 11. In this way, a series of processes on one substrate is completed.

Next, the configuration and the operation of the super-critical drying unit 18 will be described in detail.

Figure 2:
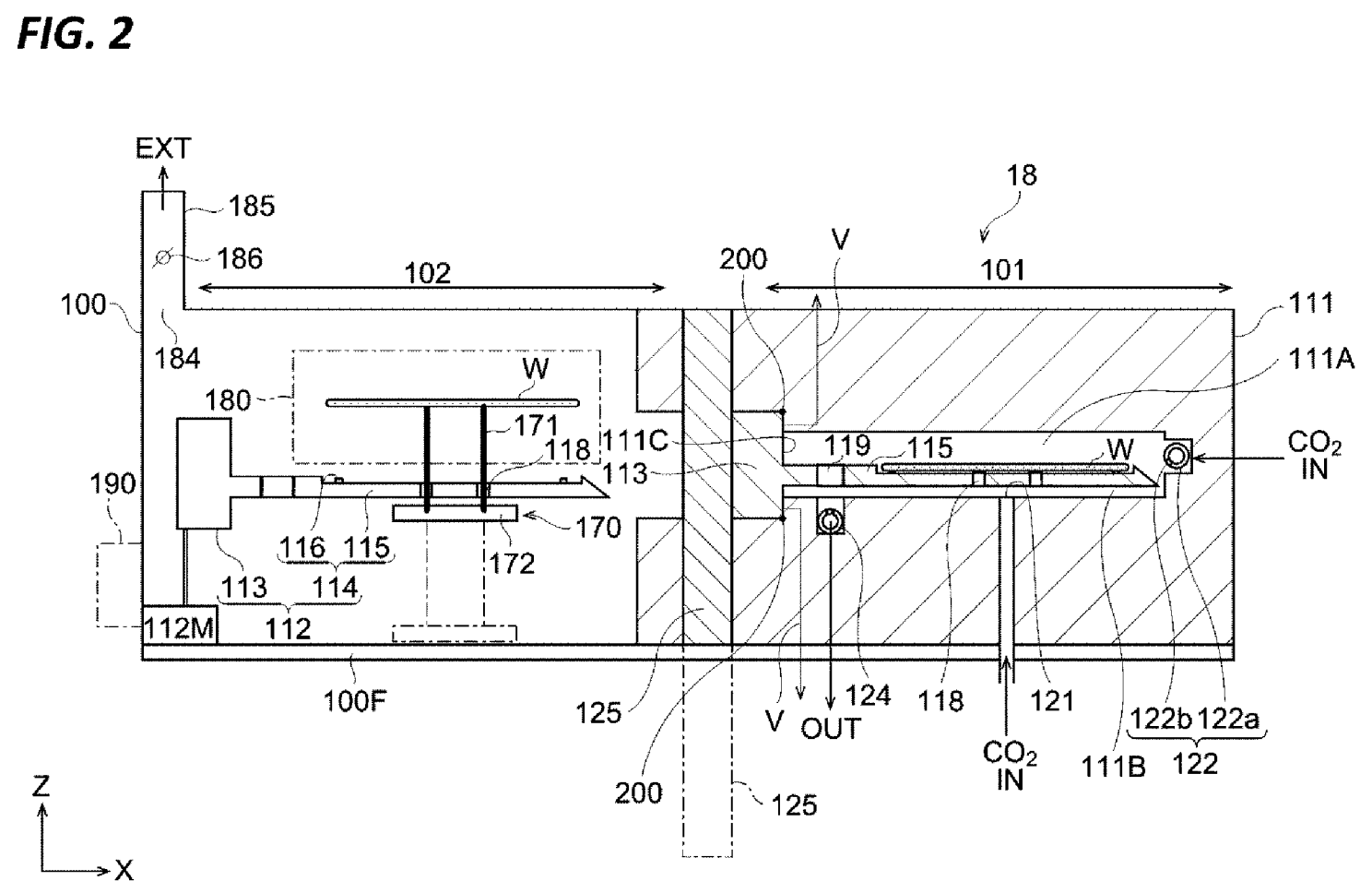

As illustrated in FIG. 2, the supercritical drying unit 18 has a housing (case) 100. In the housing 100, there is a processing region 101 (the region on the right side of FIG. 2) in which a processing container 111 is disposed as a supercritical processing chamber, and a carry-in/out region 102 (the region on the left side of FIG. 2) that serves as a work region for carrying in/out the substrate W. The housing 100 has a substantially rectangular box shape, and substantially completely encloses the processing region 101 and the carry-in/out region 102. See the housing 100 in FIG. 1.

The supercritical drying unit 18 further includes a sub-strate holding tray 112 (hereinafter, simply referred to as a "tray 112") that holds the substrate W inside the processing container 111. The tray 112 includes a lid 113 that closes an opening 111C formed in the side wall of the processing container 111, and a substrate holding unit 114 that is integrally connected to the lid (lid body) 113 and extends horizontally. The substrate holding unit 114 includes a plate 115 and a plurality of support pins 116 provided on the upper surface of the plate 115. The substrate W is placed on the support pins 116 in the horizontal posture with the surface thereof (the surface on which devices or patterns are formed) facing upward. When the substrate W is placed on the support pins 116, a gap is formed between the upper surface of the plate 115 and the lower surface (back surface) of the substrate W.

Figure 3:
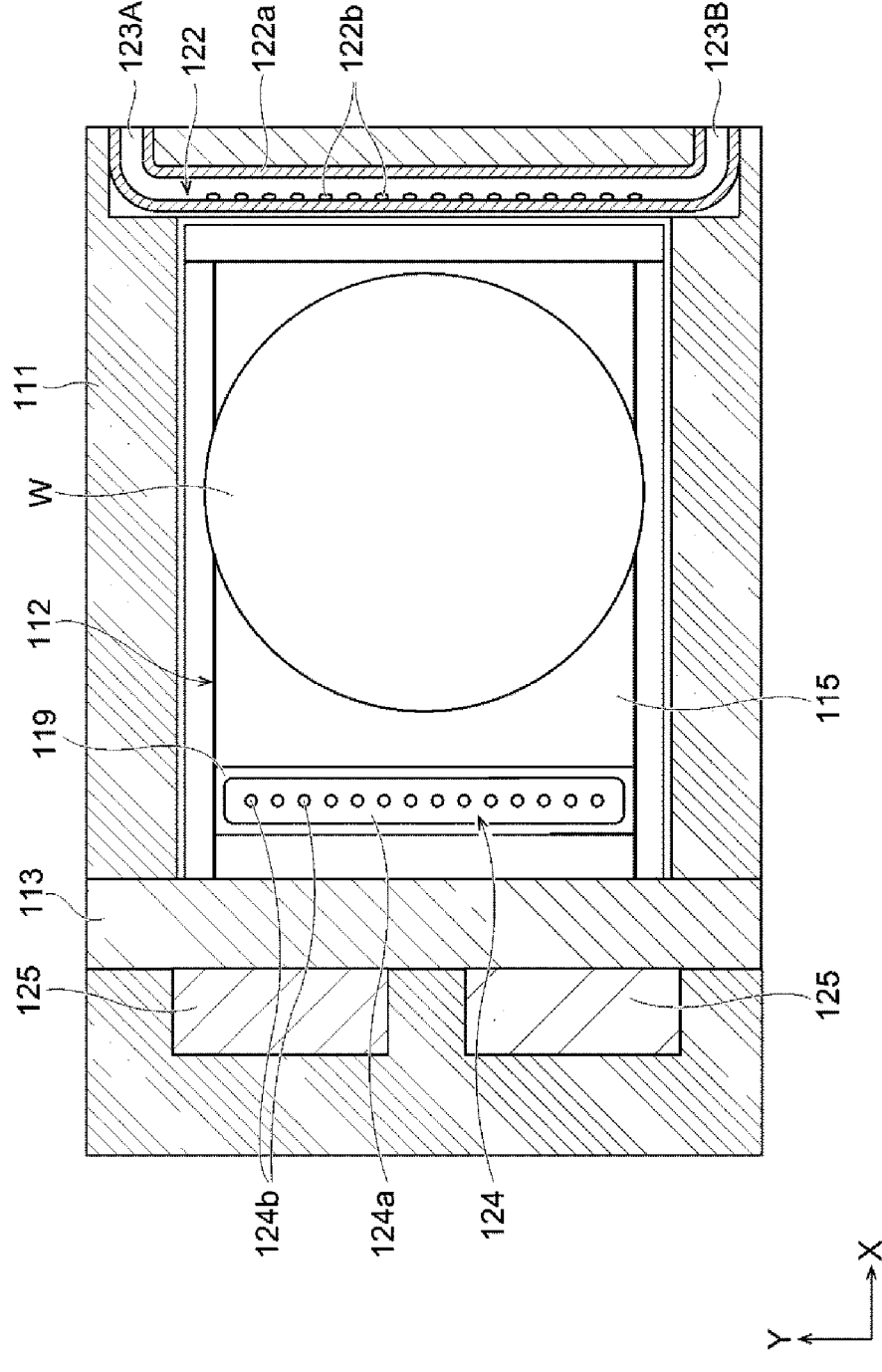
FIG. 3 is a horizontal cross-sectional view of a processing container provided in the supercritical drying unit of FIG. 2.

As illustrated in FIG. 3, the plate 115 has a substantially rectangular shape in plan view. The area of the plate 115 is larger than that of the substrate W, and the plate 115 entirely covers the substrate W when viewed from directly below in a state where the substrate W is placed at a predetermined position on the substrate holding unit 114.

As illustrated in FIG. 2, a plurality of (e.g., three) through holes 118 is formed in the plate 115 to penetrate the plate 115 vertically. The plurality of through holes 118 serve as holes through which a processing fluid supplied into the space below the plate 115 flows into the space above the plate 115. The through holes 118 also serve as holes through which lift pins 171 to be described later pass when the substrate W is delivered between the substrate holding unit 114 and the arm of the transfer device 16 (see, e.g., FIG. 1) described above.

The tray 112 is movable in the horizontal direction (X direction) between a closing position (the right position in FIG. 2) and an opening position (the left position in FIG. 2), by a tray moving mechanism 112M which is schematically illustrated as a blank square in FIG. 2. Although not illustrated in detail, the tray moving mechanism 112M may be configured with, for example, a guide rail that extends in the X direction on the floor plate 100F of the housing 100, and a moving body that is connected to the lid 113 and moves along the guide rail.

At the closing position of the tray 112, the substrate holding unit 114 is positioned within the processing region 101, more specifically, in the internal space (processing space) of the processing container 111, and the lid 113 closes the opening 111C of the side wall of the processing container 111. At the opening position of the tray 112, the substrate holding unit 114 is positioned within the carry-in/out region 102 outside the processing container 111, and the substrate W may be delivered between the substrate holding unit 114 and the transfer arm of the transfer device 16 through the lift pins 171 to be described later. Further, when the tray 112 is at the opening position, the lid 113 opens the opening 111C of the side wall of the processing container 111. Thus, the tray moving mechanism 112M may be called a lid body opening/closing mechanism.

As illustrated on the left side of FIG. 2, a substrate lifter 170 is provided in the carry-in/out region 102. The substrate lifter 170 includes a plurality of, for example, three lift pins 171, a base 172 with the upper surface onto which the lift pins 171 are fixed, and a lifting mechanism (not illustrated) that moves the base 172 up and down. The lift pins 171 are provided at positions where the lift pins 171 pass through the through holes 118 of the tray 112 located at the opening position when the lift pins 171 are moved upward to a moved-up position (indicated by a solid line in FIG. 2).

Figure 4:
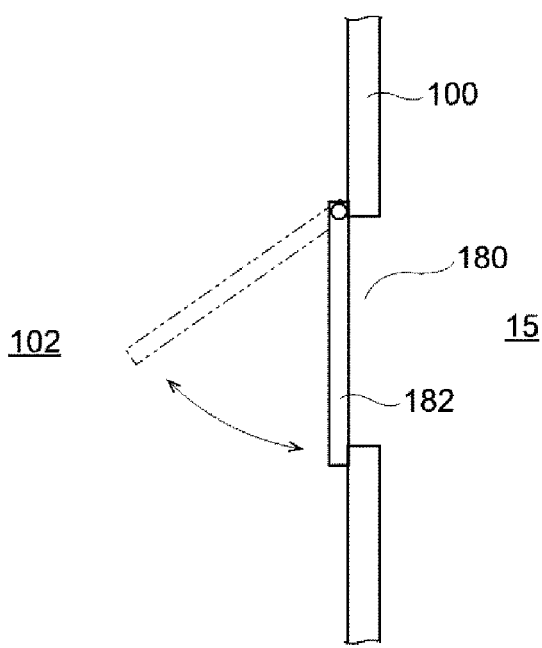
FIG. 4 is a schematic view illustrating a carry-in/out port and a door which are provided in a housing of the supercritical drying unit of FIG. 2.
Figure 4:
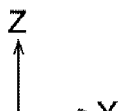

A carry-in/out port 180 is provided in the wall of the housing 100 that faces the transfer region 15, to carry the substrate W into/from the housing 100. The carry-in/out port 180 is illustrated by a long and short dashed line in FIG. 2, and is formed in the wall of the housing 100 on the front side of FIG. 2. The carry-in/out port 180 may be opened and closed by a door 182 (illustrated only in FIG. 4). The door 182 may be made in the form of a cantilever flap as illustrated in FIG. 4, or may be made in the form of a sliding door movable vertically or horizontally (X direction).

When a purge gas (dry gas) to be used as described later is nitrogen gas, the increase in concentration of the nitrogen gas may adversely affect an operator near the substrate processing system 1. Further, when the atmosphere of the transfer region 15 flows into the carry-in/out region 102, the purging effect is deteriorated. Thus, preferably, the door 182 closes the carry-in/out port 180 such that the flow of the atmosphere through the carry-in/out port 180 between the carry-in/out region 102 and the transfer region 15 (see, e.g., FIG. 1) is prevented or hardly occurs.

When the lift pins 171 of the substrate lifter 170 are at the moved-up position, the substrate transfer arm (not illustrated in FIG. 2) of the transfer device 16 (see, e.g., FIG. 1) that has entered the carry-in/out region 102 through the carry-in/out port 180 may place the substrate W on the lift pins 171 or remove the substrate W placed on the lift pins 171. That is, the lift pins 171 serve as a delivery unit that delivers the substrate with respect to the substrate transfer arm. The tray 112 and the tray moving mechanism 112M described above serve as a substrate transfer mechanism that transfers the substrate W between the delivery unit (the lift pins 171) and the processing container 111. When the lift pins 171 are at a moved-down position (indicated by a long and short dashed line in FIG. 2), the lift pins 171 do not hinder the horizontal movement of the tray 112.

Here, the description of the processing container 111 and the tray 112 is continued. When the tray 112 is at the closing position (the position on the right side of FIG. 2), the internal space of the processing container 111 is divided by the plate 115 into an upper space 111A above the plate 115 where the substrate W is present during the processing, and a lower space 111B below the plate 115. However, the upper space 111A and the lower space 111B are not completely separated, and communicate with each other through the through holes 118 and a slot 119 that are formed in the plate 115, and the gap between the peripheral edge of the plate 115 and the inner wall surface of the processing container 111.

The processing container 111 is provided with a first ejection unit 121 and a second ejection unit 122. The first ejection unit 121 and the second ejection unit 122 eject a processing fluid (carbon dioxide in this example (hereinafter, simply referred to as "$CO_2$")) supplied from a supply source 130 of a supercritical fluid (a processing fluid in a supercritical state) into the internal space of the processing container 111.

The first ejection unit 121 is provided below the plate 115 of the tray 112 located at the closing position. The first ejection unit 121 ejects $CO_2$ (processing fluid) into the lower space 111B toward the lower surface of the plate 115 (upward). The first ejection unit 121 may be configured as a through hole formed in the bottom wall of the processing container 111. The first ejection unit 121 may be a nozzle body attached to the bottom wall of the processing container 111.

The second ejection unit 122 is provided to be positioned in front of the substrate W placed on the substrate holding unit 114 of the tray 112 located at the closing position (the position moved in the positive X direction). The second ejection unit 122 supplies $CO_2$ into the upper space 111A in the substantially horizontal direction or slightly obliquely downward. In the illustrated embodiment, the second ejection unit 122 is provided on the side wall of the processing container 111 opposite to the lid 113.

As illustrated in FIG. 3, the second ejection unit 122 is configured as a rod-shaped nozzle body. Specifically, the second ejection unit 122 is formed by forming a plurality of ejection holes 122b in a tube 122a extending in the width direction (Y direction) of the substrate W. The plurality of ejection holes 122b are, for example, arranged at equal intervals in the Y direction. Each ejection hole 122b supplies $CO_2$ into the upper space 112A toward the opening 111C (substantially in the negative X direction).

The processing container 111 is further provided with a fluid discharge unit 124 that discharges the processing fluid from the internal space of the processing container 111. The fluid discharge unit 124 is configured as a header having substantially the same configuration as that of the second ejection unit 122. Specifically, the fluid discharge unit 124 is formed by forming a plurality of discharge holes 124b in a tube 124a that extends horizontally. The plurality of discharge holes 124b are, for example, arranged at equal intervals in the Y direction. Each discharge hole 124b faces upward, and also faces the slot 119 of the plate 115.

In the illustrated embodiment, the fluid discharge unit 124 is provided in a recess formed in the bottom wall of the processing container 111 near the opening 111C. $CO_2$ flows through the region above the substrate W in the upper space 111A as indicated by an arrow in FIG. 6H, thereafter, flows into the lower space 111B through the slot 119 formed in the plate 115 (or the communication passage provided in the peripheral edge of the plate 115), and then, is discharged from the fluid discharge unit 124.

The processing container 111 is provided with a lock mechanism that fixes the tray 112 at the closing position. The lock mechanism includes a bar-shaped lock member 125 that moves up and down along a guide hole or a guide groove formed in the processing container 111 by a lifting mechanism (e.g., an air cylinder or a ball screw) (not illustrated). FIG. 2 illustrates the lock member 125 at the moved-up position (locked position) by a solid line, and illustrates the lock member 125 at the moved-down position (unlocked position) by a long and short dashed line.

As schematically illustrated by an arrow V in FIG. 2, an adsorption line is formed in the processing container 111 to vacuum-adsorb the lid 113 of the tray 112 located at the closing position to the facing surface of the processing container 111. The adsorption line is connected to an adsorption device such as a vacuum pump. When the tray 112 is moved to the closing position, and then, the lid 113 is adsorbed, a seal member 200 (schematically illustrated only in FIG. 2) provided between the lid 113 and the processing container 111 is pressed, so that the lid 113 may come into close contact with the facing surface of the processing container 111. As a result, the lock member 125 may be smoothly moved to the moved-up position (locked position) illustrated in FIG. 2. When the lock member 125 is at the moved-up position, the tray 112 does not move in the opening direction (negative X direction) even though the internal pressure of the processing container 111 increases.

In the housing 100, an exhaust port 184 is provided to discharge the atmosphere inside the carry-in/out region 102. The exhaust port 184 is connected to an exhaust duct (decompressed by suction) of a semiconductor device manufacturing plant where the substrate processing system 1 is installed, via an exhaust path (exhaust pipe) 185. A valve 186, for example, a butterfly valve is provided in the exhaust port 184 or the exhaust path 185. By adjusting the opening degree of the valve 186, the flow rate of a gas discharged from the exhaust port 184 may be adjusted.

Figure 5:
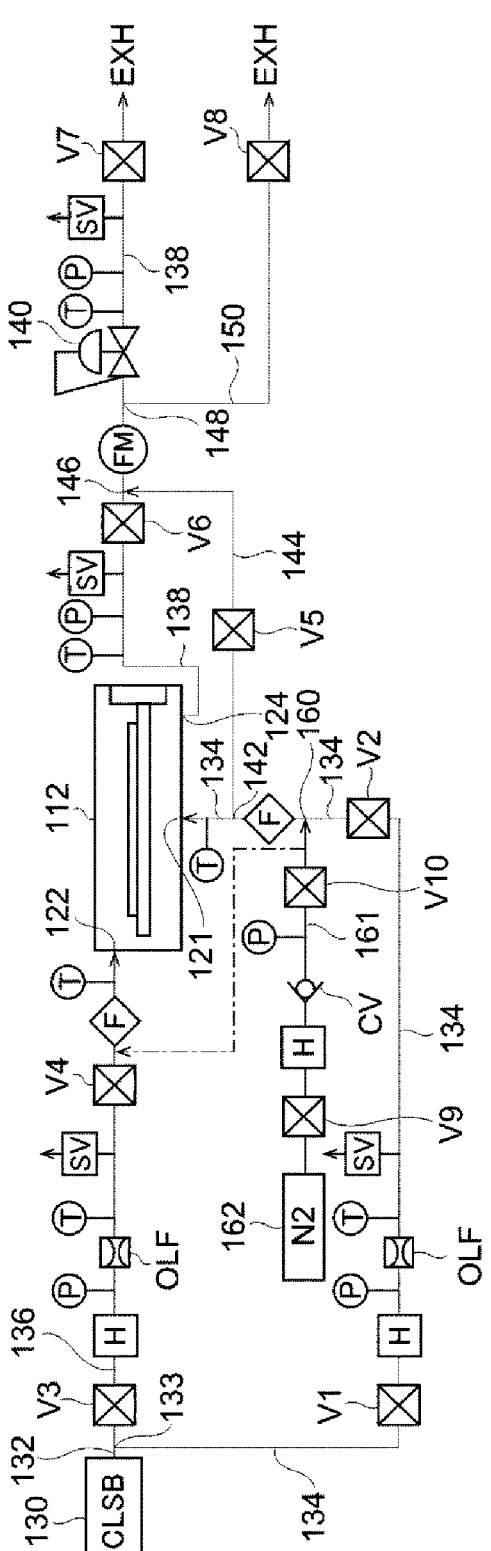
FIG. 5 is a view illustrating a configuration of a piping system for supplying and discharging a processing fluid into/from the supercritical drying unit of FIG. 2.

Next, descriptions will be made on a supply/discharge system that supplies and discharges the processing fluid ($CO_2$) into/from the processing container 111 in the supercritical drying unit 18, with reference to FIG. 5. In the piping system view illustrated in FIG. 5, a member indicated by circled T is a temperature sensor, and a member indicated by a circled P is a pressure sensor. A member denoted by OLF is an orifice (fixed throttle) which lowers the pressure of $CO_2$ flowing in a pipe downstream thereof to a desired value. A member indicated by SV surrounded by a square is a safety valve (relief valve) which prevents the damage to components of a supercritical drying apparatus such as pipes and sensors due to an unexpected excessive pressure. A member denoted by F is a filter which removes contaminants such as particles included in $CO_2$. A member denoted by CV is a check valve (non-return valve). A member indicated by circled FV is a flowmeter. A member indicated by H surrounded by a square is a heater for controlling the temperature of $CO_2$. A member denoted by V is an ON/OFF valve. When any one of the above-described various members needs to be distinguished from the other, it will be denoted by adding a numeral to its reference alphabet (e.g., "ON/OFF valve V2"). FIG. 5 illustrates ten ON/OFF valves V, to which reference numerals V1 to V10 are assigned, for distinguishing the valves from each other.

The supercritical drying apparatus includes a supercritical fluid supply device 130 as the supply source of the supercritical fluid (supercritical $CO_2$). The supercritical fluid supply device 130 has a known configuration including, for example, a carbon dioxide cylinder, a booster pump, and a heater. The supercritical fluid supply device 130 has an ability to deliver the supercritical $CO_2$ at a pressure exceeding a pressure that assures the supercritical state (specifically, about 16 MPa) to be described later.

A main supply line 132 is connected to the supercritical fluid supply device 130. In this description, a member called a "line" may be configured as a pipe (piping member).

The main supply line 132 branches into a first supply line 134 and a second supply line 136 at a branch point 133. The first supply line 134 is connected to the first ejection unit 121 of the processing container 111. The second supply line 136 is connected to the second ejection unit 122 of the processing container 111. In the piping system view of FIG. 5, the first supply line 134 extends substantially in a U shape as a whole between the branch point 133 and the second ejection unit 122.

A discharge line 138 is connected to the fluid discharge unit 124 of the processing container 111. A pressure adjusting valve 140 is provided in the discharge line 138. By adjusting the opening degree of the pressure adjusting valve 140, the primary-side pressure of the pressure adjusting valve 140 may be adjusted, so that the pressure inside the processing container 111 may be adjusted. Further, by adjusting the opening degree of the pressure adjusting valve 140, the discharge velocity of the processing fluid from the processing container 111 may also be adjusted.

The control device 6 illustrated in FIG. 1 or its subordinate controller performs a feedback control of the opening degree of the pressure adjusting valve 140 (specifically, the position of the valve body) to maintain the pressure in the processing container 111 at a set value (SV), based on a difference between a measured value (PV) of the pressure in the processing container 111 and the set value. As the measured value of the pressure in the processing container 111, for example, a detected value of a pressure sensor denoted with a reference number PS between the ON/OFF valve V3 of the discharge line 138 and the processing container 111, as illustrated in FIG. 5. The pressure adjusting valve 140 may be set to a fixed opening degree based on a command value from the control device 6 (rather than the feedback control).

A bypass line 144 branches from the first supply line 134 at a branch point 142 set on the first supply line 134. The bypass line 144 is connected to the discharge line 138 at a confluence 146 set in the discharge line 138. The confluence 146 is present upstream of the pressure adjusting valve 140.

On the upstream side of the pressure adjusting valve 140, a branch discharge line 150 branches from the discharge line 138 at a branch point 148 set in the discharge line 138. The downstream end of the branch discharge line 150 is, for example, open to the atmospheric space outside the supercritical drying apparatus or connected to a plant exhaust duct. The downstream end of the discharge line 138 is connected to a plant exhaust duct directly or through a recovery device (not illustrated) that recovers useful components (e.g., IPA) contained in $CO_2$.

A purge gas supply line 161 is connected to a confluence 160 set directly upstream of a filter F of the first supply line 134. The upstream end of the purge gas supply line 161 is connected to a purge gas supply source 162. The purge gas supply line 161 is provided with an ON/OFF valve V9, a heater H for heating a purge gas, a check valve CV, and an ON/OFF valve V10 in this order from upstream. In this embodiment, the purge gas is a gas having a lower moisture content (humidity) than that of the air in a clean room, that is, a dry gas, and is specifically nitrogen gas ($N_2$ gas). As for the purge gas, a purge gas provided as a factory power may be used.

A heat insulating material or a pipe heater is preferably provided in the portion of the purge gas supply line 161 on the downstream side of a heater H and the portion of the first supply line 134 from the confluence 160 to the first discharge unit 121, to keep the lines (pipes) warm. Examples of the pipe heater include a tape heater (ribbon heater), a jacket heater, and a mantle heater. A pipe may have a double-pipe structure, such that the purge gas flows through the inner pipe, and a heating fluid flows through the outer pipe.

In an embodiment, a heat insulating material is provided in the region from the heater H to the ON/OFF valve V10 of the purge gas supply line 161, and pipe heaters are provided in the region between the ON/OFF valve V10 of the purge gas supply line 161 and the confluence 160 and the region between the confluence 160 of the first supply line 134 and the connection point of the first supply line 134 to the processing container 111.

Next, descriptions will be made on the processing of one substrate W and the one-cycle operation of the supercritical drying apparatus 18 related thereto. The operation described herein below is automatically performed under the control of the control device 6 illustrated in FIG. 1 or its subordinate controller.

Figure 6A:
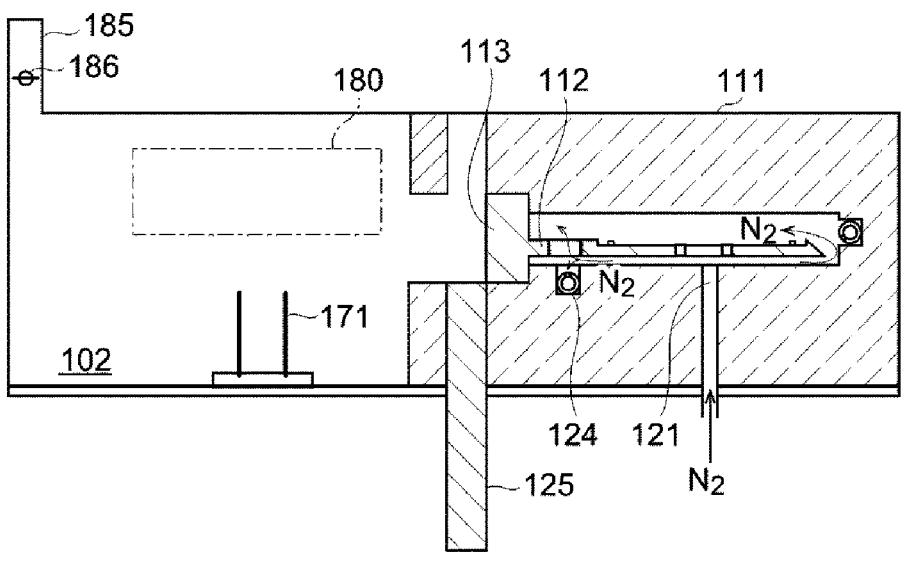
FIG. 6A is an operation view illustrating an operation of the supercritical drying unit.

Prior to performing the carry-in of the substrate W, the lock member 125 is moved downward to the moved-down position, and brought into a state of waiting for the opening of the tray 112 (Step 1). At this time, a purge gas (here, hot $N_2$ gas (heated nitrogen gas) is used) has already been ejected into the processing container 111 from the first ejection unit 121. FIG. 6A illustrates this state. The ejection of the purge gas is performed by closing the ON/OFF valves V2, V4, V5, and V6 and opening the ON/OFF valves V9 and V10. The states of the other ON/OFF valves are arbitrary. At this time, the ON/OFF valves V6 and V7 may be opened, and the pressure adjusting valve 140 may be set to an appropriate small opening degree, so as to supply the purge gas into the processing container 111 while removing the air from the processing container 111 through the fluid discharge unit 124.

Figure 6B:
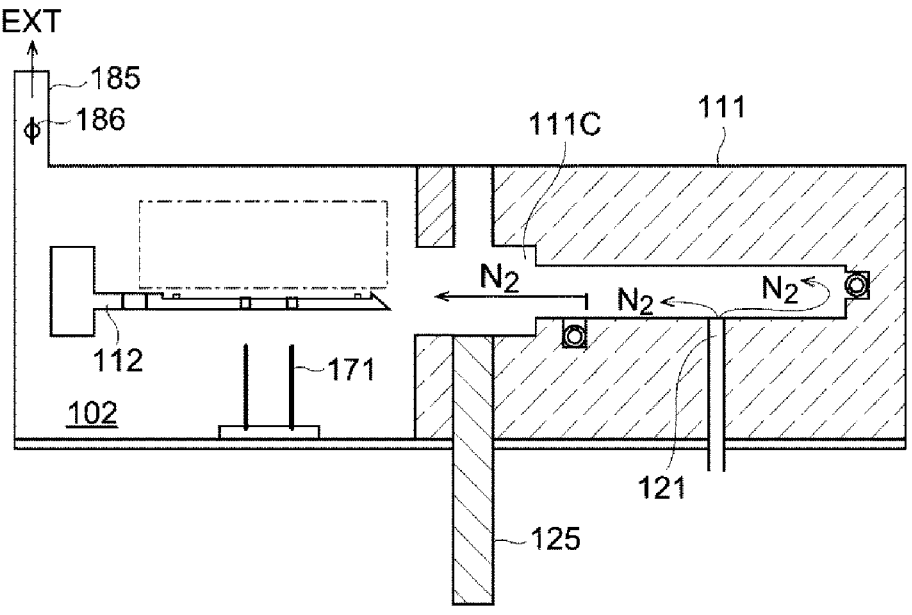
FIG. 6B is an operation view illustrating an operation of the supercritical drying unit.

Next, as illustrated in FIG. 6B, the tray 112 is moved to the opening position (Step 2). As a result, the purge gas supplied into the processing container 111 flows out into the carry-in/out region 102 through the opening 111C. As time elapses, the concentration of the purge gas in the carry-in/out region 102 increases, and as a result, the humidity (moisture content in the atmosphere) in the carry-in/out region 102 decreases. At this time, the atmosphere in the processing container 111 is also purged with the purge gas. Further, at this time, it is preferable to open the valve 186, thereby exhausting the atmosphere in the carry-in/out region 102 through the exhaust path 185. As a result, the replacement with the nitrogen gas atmosphere in the carry-in/out region 102 may be accelerated, and the leakage of the nitrogen gas into the transfer region 15 may be reliably prevented.

Figure 6C:
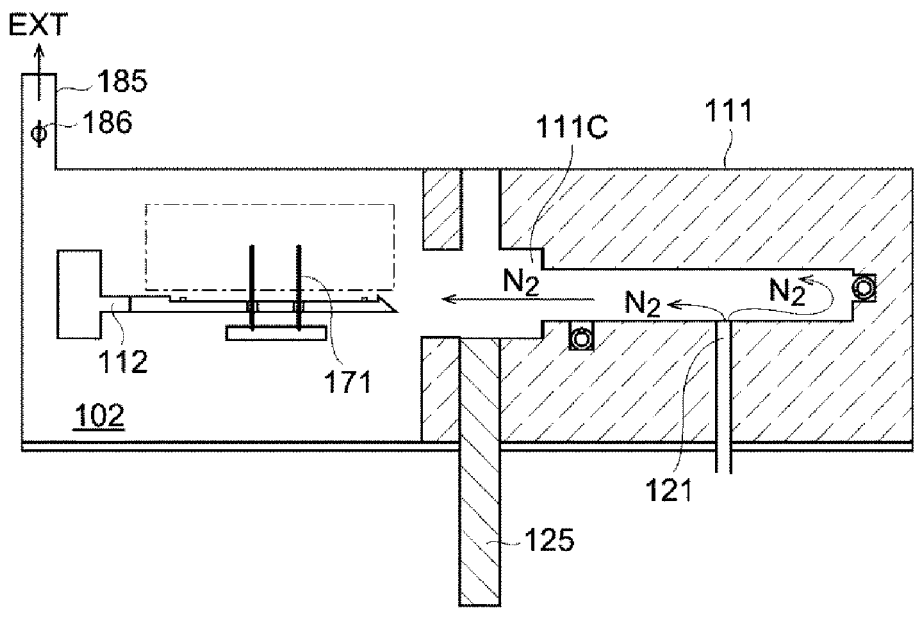
FIG. 6C is an operation view illustrating an operation of the supercritical drying unit.

Next, as illustrated in FIG. 6C, the lift pins 171 are moved upward to the moved-up position, inserted through the through holes 118 of the plate 115, and brought into a state of waiting for the delivery (Step 3). At this time as well, the purge gas supplied into the processing container 111 continues to flow out into the carry-in/out region 102 through the opening 111C.

Figure 6D:
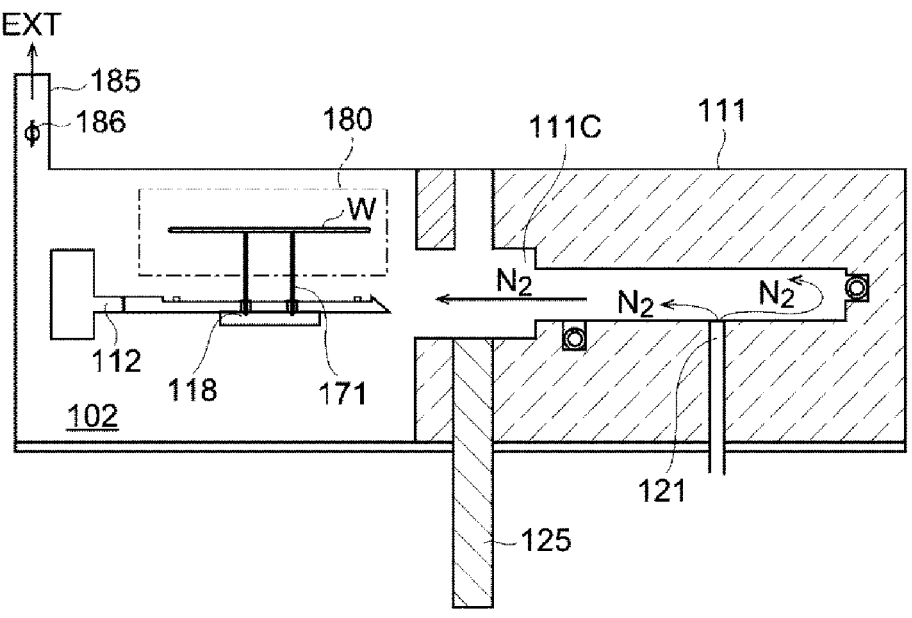
FIG. 6D is an operation view illustrating an operation of the supercritical drying unit.

When the atmosphere in the processing container 111 and the atmosphere in the carry-in/out region 102 are sufficiently replaced with the purge gas, the door 182 of the carry-in/out port 180 is opened, and the arm of the transfer device 16 enters the carry-in/out region 102 through the carry-in/out port 180 in a state of holding the substrate W with the IPA puddle formed on its surface (see FIG. 1), and places the substrate W on the lift pins 171 (Step 4). FIG. 6D illustrates this state.

The description "the atmosphere in the carry-in/out region 102 is sufficiently replaced with the purge gas" indicates, for example, that the humidity in the carry-in/out region 102 has reached a predetermined value or less (e.g., humidity of 25%), or the concentration of purge gas (nitrogen gas) has reached a predetermined value or more (e.g., nitrogen concentration of 85%). A sensor may be provided to detect the humidity or the nitrogen concentration of the atmosphere in the carry-in/out region 102. Alternatively, the humidity or the nitrogen concentration of the atmosphere in the carry-in/out region 102 may be regarded as reaching a desired value when a predetermined time elapses from the start of Step 2.

In order to reduce the time for the one cycle, it is preferable to rapidly replace the atmosphere in the carry-in/out region 102 with the purge gas. To this end, in Step 1, the purge gas may be leaked into the carry-in/out region 102 from the processing container 111 through the gap between the processing container 111 and the lid 113 without sealing the opening 111C of the processing container 111 with the lid 113. Alternatively, when the tray 112 starts to move to the opening position in Step 2 and the lid 113 starts to open the opening, the flow rate of the ejection of the purge gas from the first ejection unit 121 may be increased.

When the purge gas is leaked from the processing container 111 into the carry-in/out region 102 as described above in Step 1, the processing container 111 may not be exhausted through the discharge line 138. Then, the purge gas may be effectively used to adjust the atmosphere of the carry-in/out region 102 without discarding the purge gas. However, the purge gas may be discharged from the processing container 111 through the discharge line 138 by sealing the gap between the processing container 111 and the lid 113.

Figure 6E:
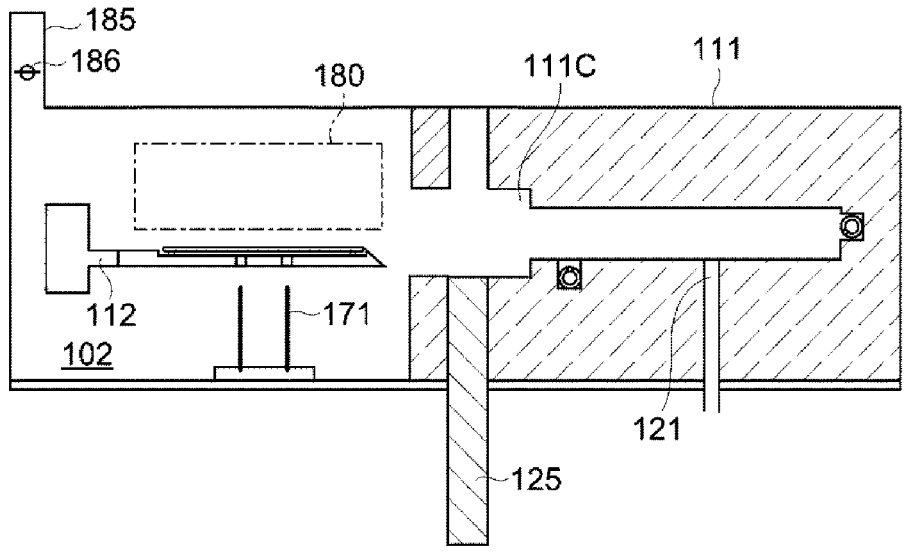
FIG. 6E is an operation view illustrating an operation of the supercritical drying unit.

When the substrate W is placed on the lift pins 171, the lift pins 171 are moved downward to the moved-down position. During the downward movement, the substrate W is delivered from the lift pins 171 onto the tray 112 (more specifically, onto the support pins 116 of the substrate holding unit 114) (Step 5). FIG. 6E illustrates the state at this time.

Figure 6F:
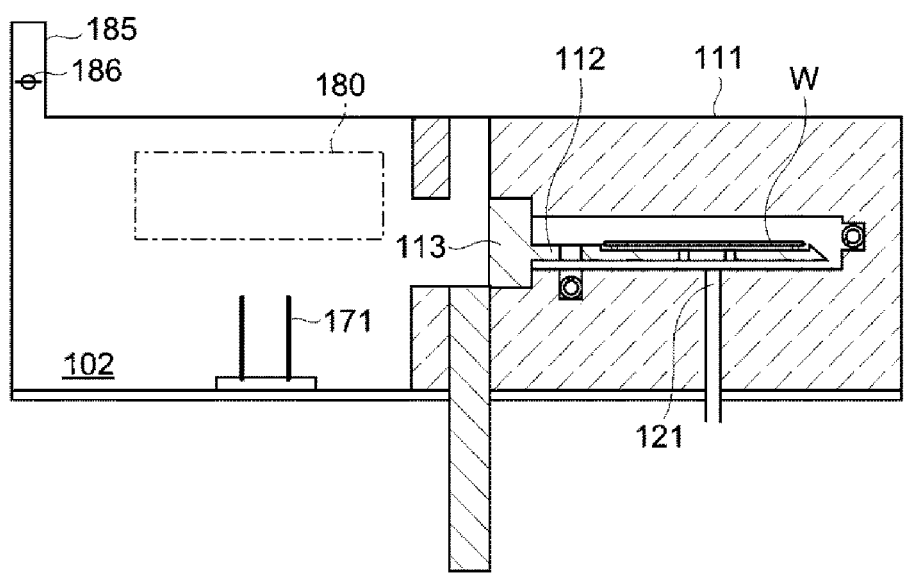
FIG. 6F is an operation view illustrating an operation of the supercritical drying unit.

Next, the tray 112 moves to the closing position, such that the substrate holding unit 114 holding the substrate W is accommodated in the internal space of the processing container 111, and the opening 111C of the processing container 111 is closed by the lid 113 (Step 6). FIG. 6F illustrates the state at this time. When the opening 111C is closed by the lid 113, the ejection of the purge gas from the first ejection unit 121 is stopped.

When the substrate W is placed on the tray 112 in Step 5, the substrate W is positioned in the middle of the main flow of the purge gas that flows out into the carry-in/out region 102 through the opening 111C. The flow of purge gas should not cause any adverse effects (significant evaporation of IPA, shaking, or shedding from the substrate) on the IPA puddle on the surface of the substrate W. In order to prevent these adverse effects, the flow rate of the ejection of the purge gas from the first ejection unit 121 may be reduced when the substrate W is placed on the tray 112. Alternatively, the flow rate of the ejection of the purge gas from the first ejection unit 121 may be reduced when the tray 112 with the substrate W placed thereon starts to move toward the processing container 111 in Step 6, and then, the distance between the substrate W and the opening 111C reaches a predetermined distance or shorter. As long as the humidity in the carry-in/out region 102 become sufficiently low, the ejection of the purge gas from the first ejection unit 121 may be stopped when the substrate W is placed on the tray 112.

The purge gas may be ejected from the second ejection unit 122 into the processing container 111. In this case, a line indicated by a long and short dashed line in FIG. 5 is used. However, when the purge gas is ejected from the second ejection unit 122, the purge gas may collide directly with the IPA puddle on the substrate W, in particular, as the tray 112 holding the substrate W approaches the closing position, which is highly likely to cause the above-described adverse effects. In order to avoid the adverse effects, for example, a precise control is required for the ejection flow rate of the purge gas. Thus, it is preferable to eject the purge gas from the first ejection unit 121. When the purge gas is ejected from the first ejection unit 121, the purge gas hardly collides directly with the IPA puddle on the substrate W at a high flow velocity, regardless of the position of the tray 112 holding the substrate.

When the substrate W is accommodated in the processing container 111, the lid 113 is then adsorbed through the adsorption line provided in the wall of the processing container 111 (see an arrow V in FIG. 6G), and the lid 113 is adsorbed to the processing container 111 (Step 7). As a result, the seal member 200 (schematically illustrated by black circles in only FIG. 2) that seals the gap between the facing surfaces of the lid 113 and the processing container 111 is strongly pressed.

Figure 6G:
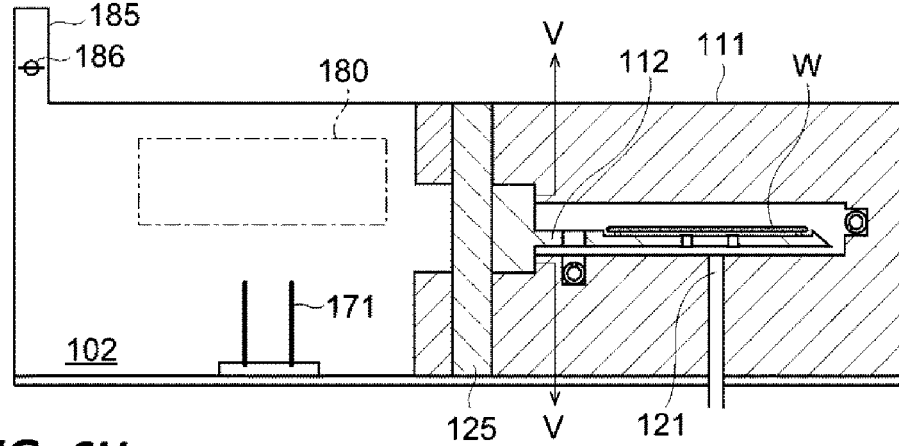
FIG. 6G is an operation view illustrating an operation of the supercritical drying unit.

In this state, the lock member 125 is moved upward to the moved-up position (locked position) illustrated in FIG. 2 (Step 8). At this time, since the lid 113 is in close contact with the processing container 111, the lock member 125 may be smoothly moved up. FIG. 6G illustrates this state. Next, the adsorption of the lid 113 is released (Step 9). Even after the adsorption of the lid 113 is released, the lid 113 is still pressed against the processing container 111 by the lock member 125, and the seal member 200 illustrated in FIG. 2 sufficiently seals the gap between the facing surfaces of the lid 113 and the processing container 111. That is, an airtight processing space is formed inside the processing container 111.

Next, in the processing container 111, a supercritical drying process is performed on the substrate W according to a known procedure (Step 10). An example of each step (a pressure increasing step, a circulation step, or a discharge step) of the supercritical drying process will be described briefly. The ON/OFF valves V9 and V10 of the purge gas supply line 161 are closed before the start of the supercritical drying process, and remain closed until the supercritical drying process ends. The supercritical drying process has only to include the pressure increasing step, the circulation step, and the discharge step, and detailed procedures in each step are not limited to those described below.

In the pressure increasing step, the ON/OFF valves V1, V2, V5, and V7 are opened, and the ON/OFF valves V3, V4, V6, and V8 are closed. The opening degree of the pressure adjusting valve 140 is fixed at an appropriate fixed opening degree. $CO_2$ supplied in the supercritical state from the supercritical fluid supply device 130 to the main supply line 132 flows into the processing container 111 through the first supply line 134 and the first ejection unit 121. As the processing container 111 is filled with $CO_2$, the pressure inside the processing container 111 increases.

By opening the ON/OFF valve V5 immediately after the start of the pressure increasing step, a portion of $CO_2$ that has flowed into the first supply line 134 is dispersed into a bypass line 144, so that gaseous $CO_2$ is prevented from flowing at excessive flow rate and velocity into the processing container 111 having the high pressure. Further, during the opening of the ON/OFF valve V5, the ON/OFF valves V7 and V8 may be closed such that $CO_2$ stays in the downstream line of the processing container 111. When the internal pressure of the processing container 111 increases to some extent, the ON/OFF valve V5 is closed to continue the pressure increasing process.

In the pressure increasing step, $CO_2$ is caused to flow into the processing container 111 from the first ejection unit 121, so that it is possible to prevent gaseous $CO_2$ from colliding with the IPA puddle on the surface of the substrate W at a high flow velocity, thereby causing the adverse affects on the IPA.

When the pressure in the processing container 11 exceeds a critical pressure of $CO_2$ (about 8 MPa), the $CO_2$ in the critical state dissolves in the IPA on the substrate W. The pressure increasing step is continued until the pressure in the processing container 111 reaches the pressure ensuring that the mixed fluid (CO+IPA) remains in a supercritical state, regardless of the IPA concentration in the mixed fluid on the substrate W, and the temperature of the mixed fluid. The supercritical state ensuring pressure is about 16 MPa.

When it is detected that the pressure in the processing container 111 reaches the supercritical state ensuring pressure, the ON/OFF valves V1, V2, V5, and V8 are closed, the ON/OFF valves V3, V4, V6, and V7 are opened, the operation mode of the pressure adjusting valve 140 is switched to the feedback control mode, and the circulation step is started. At this time, the control device 6 (or its subordinate controller) performs the feedback control for adjusting the opening degree (manipulation value MV) of the pressure adjusting valve 140, such that the pressure in the processing container 111 is maintained at a set value (set value SV=16 MPa). Specifically, the opening degree (manipulation value MV) of the pressure adjusting valve 140 is feedback-controlled, such that the internal pressure of the processing container 111 (measured value PV) detected by a pressure sensor P provided in the discharge line 138 immediately downstream of the processing container 111 matches the set value SV.

Figure 6H:
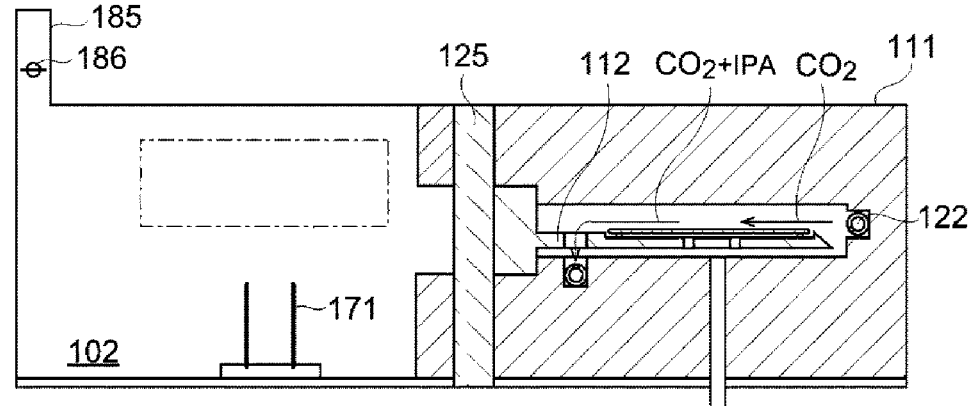
FIG. 6H is an operation view illustrating an operation of the supercritical drying unit.

In the circulation step, the supercritical $CO_2$ supplied from the second ejection unit 122 into the processing container 111 flows on the upper region of the substrate, and then, is discharged from the fluid discharge unit 124. At this time, a laminar flow of the supercritical $CO_2$ that flows substantially parallel to the surface of the substrate W is formed in the processing container 111. The IPA in the mixed fluid (IPA+$CO_2$) on the surface of the substrate W exposed to the laminar flow of the supercritical $CO_2$ is replaced with the supercritical $CO_2$. Finally, almost all of the IPA on the surface of the substrate W is replaced with the supercritical $CO_2$. FIG. 6H illustrates the state where the circulation step is being performed.

The mixed fluid of the IPA and the supercritical $CO_2$ that has been discharged from the fluid discharge unit 124 is recovered after flowing through the discharge line 138. The IPA contained in the mixed fluid may be separated and reused.

When the IPA on the substrate W is completely replaced with the supercritical $CO_2$, the ON/OFF valves V1, V2, V3, V4, and V5 are closed, the ON/OFF valves V6, V7, and V8 are opened, the opening degree of the pressure adjusting valve 140 is fixed at a large opening degree, the discharge step is started, and the set pressure of the processing container 111 is lowered to normal pressure. As the pressure inside the processing container 111 decreases, the supercritical $CO_2$ in the patterns of the substrate W is turned into gas and leaves the patterns, so that the gaseous $CO_2$ is discharged from the processing container 111. Finally, the ON/OFF valve V5 is opened to remove the $CO_2$ remaining between the ON/OFF valve V1 and the ON/OFF valve V5. Then, the supercritical drying process on one substrate W is completed.

Figure 6I:
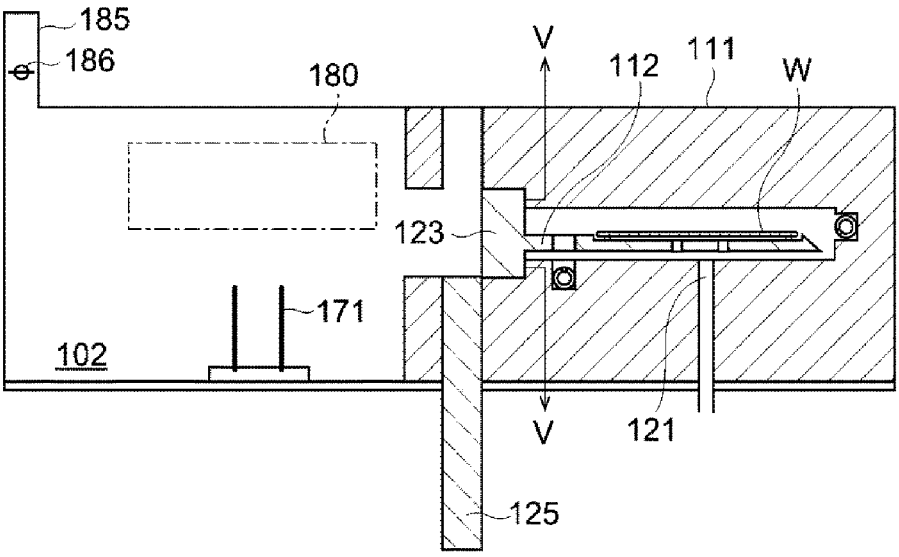
FIG. 6I is an operation view illustrating an operation of the supercritical drying unit.

When the supercritical drying process on the substrate W is completed, the lid 113 is adsorbed through the adsorption line provided in the wall of the processing container 111, and is vacuum-adsorbed to the processing container 111 (Step 11). In this state, the lock member 125 is moved downward to the moved-down position (unlocked position) (Step 12). FIG. 6I illustrates the state at this time. When the lock member 125 moves to the moved-down position, the adsorption of the lid 113 is released (Step 13).

Figure 6J:
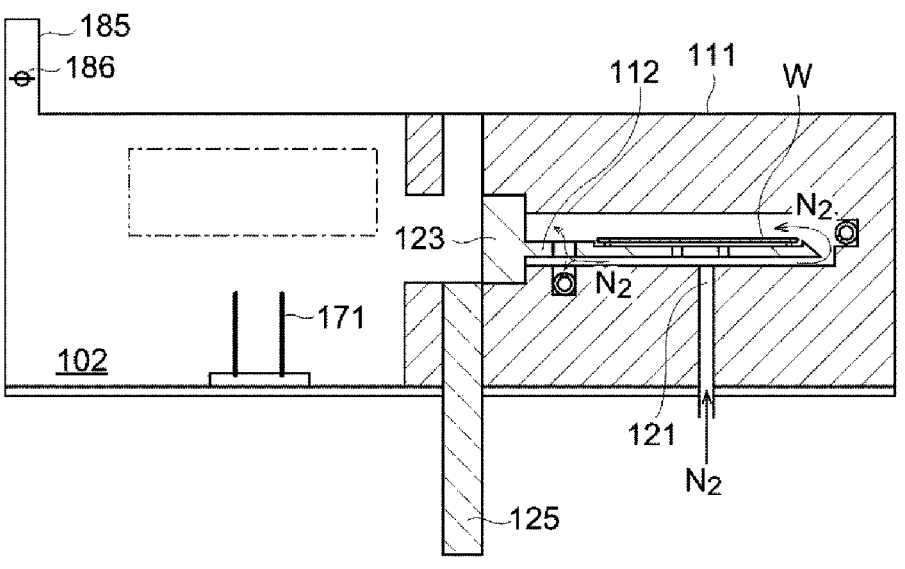
FIG. 6J is an operation view illustrating an operation of the supercritical drying unit.

When the adsorption of the lid 113 is released in Step 13, the purge gas is ejected again from the first ejection unit 121 (see, e.g., FIG. 6J). The purge gas does not significantly affect the state of the processed (dried) substrate W. However, it is beneficial to continue the supply of the purge gas, because the low-humidity atmosphere of the processing container 111 and the carry-in/out region 102 is continuously maintained, which results in reducing, for example, the time required for one cycle for the next substrate W. Thus, once the ejection of the purge gas is restarted in Step 13, it is preferable to continuously eject the purge gas from the first ejection unit 121 until the final step of the present cycle.

Then, the tray 112 is moved to the opening position (Step 14). The state at this time is the same as illustrated in FIG. 6E. The ejection of the purge gas from the first ejection unit 121 may be started when the tray 112 starts to move to the opening position. When the purge gas is ejected from the first ejection unit 121 in a large flow rate in a case where the tray 112 is positioned close to the inner space of the processing container 111 (e.g., when a portion of the tray 112 is positioned inside the processing container 111), a positional deviation of the substrate W may occur on the tray 112. Thus, the purge gas may be ejected from the first ejection unit 121 in a small flow rate until the tray 112 is separated from the inner space of the processing container 111 by a predetermined distance, and the ejection flow rate of the purge gas may be increased after the tray 112 is separated by the predetermined distance.

Next, the lift pins 171 are moved upward to the moved-up position (Step 15). As a result, the lift pins 171 move up through the through holes 118 of the plate 115 to lift the substrate W above the plate 115, and the substrate W is ready to be delivered. The state at this time is the same as illustrated in FIG. 6D.

Next, the door 182 of the carry-in/out port 180 is opened, and the arm of the transfer device 16 (see, e.g., FIG. 1) holding the substrate W enters the carry-in/out region 102 through the carry-in/out port 180, and removes the substrate W from the lift pins 171 (Step 16). The state at this time is the same as illustrated in FIG. 6C. Then, the arm of the transfer device 16 retreats from the carry-in/out region 102, and the door 182 is closed.

Next, the lift pins 171 are moved downward to the moved-down position (Step 17). The state at this time is the same as illustrated in FIG. 6B. Next, the tray 112 is moved to the closing position to be brought into the same state as in Step 1. The state at this time is the same as illustrated in FIG. 6A.

Next, descriptions will be made on the operation of the exhaust path 185 that exhausts the atmosphere in the carry-in/out region 102 of the housing 100. Since the processing container 111 is sealed during Steps 7 to 13, no new purge gas is supplied into the carry-in/out region 102. Further, since the processing container 111 is sealed and the door 182 is closed during Steps 7 to 13, no contaminants enter the carry-in/out region 102. Accordingly, the carry-in/out region 102 does not need to be exhausted through the exhaust path 185 during Steps 7 to 13.

During Steps 2 to 6 and Steps 14 to 17, the purge gas supplied into the processing container 111 flows out into the carry-in/out region 102. At this time, by exhausting the atmosphere in the carry-in/out region 102 through the exhaust path 185, the replacement of the atmosphere in the carry-in/out region 102 with the purge gas may be accelerated. The carry-in/out region 102 may be exhausted through the exhaust path 185 at a flow rate substantially equal to the flow rate of the purge gas flowing into the carry-in/out region 102. In order to adjust the exhaust flow rate from the exhaust port, the opening degree of the valve 186 provided in the exhaust path 185 is adjusted. By adjusting the exhaust flow rate through the exhaust path 185 such that the pressure in the carry-in/out region 102 and the pressure in the transfer region 15 are substantially equal (e.g., by the feedback control), the atmosphere transfer between the carry-in/out region 102 and the transfer region 15 may be suppressed to the minimum. The atmosphere transfer may occur when the door 182 is opened, or when there is a gap between the edge of the carry-in/out port 180 and the door 182 even though the door 182 is closed. In a case where a gas adversely affecting the human body when its concentration in the atmosphere increases (e.g., nitrogen gas) is used as the purge gas, the safety of an operator or worker of the apparatus may be threatened when the purge gas flows out in a large amount from the carry-in/out region 102 into the transfer region 15. However, this risk may be eliminated by making the pressure in the carry-in/out region 102 substantially equal to the pressure in the transfer region 15.

According to the embodiment above, the purge gas is supplied into the carry-in/out region 102 before the substrate W with the IPA puddle formed on its surface is carried into the carry-in/out region 102, so that the amount of moisture (humidity) in the atmosphere of the carry-in/out region 102 is reduced. Thus, it is possible to prevent particles from remaining on the surface of the dried substrate due to the dissolution of moisture in the IPA (absorption of moisture in the IPA).

According to the embodiment above, the purge gas is supplied into the carrying-in/out region 102 through the first ejection unit 121 and the internal space of the processing container 111. Thus, not only the amount of moisture in the atmosphere inside the carry-in/out region 102 but also the amount of moisture in the internal space of the processing container 111 may be reduced. As a result, the dissolution of moisture in the IPA on the substrate W may be suppressed even after the substrate W is carried into the internal space of the processing container 111. Further, it is unnecessary to provide a dedicated purge gas supply device for supplying the purge gas into the carry-in/out region 102.

In the embodiment above, the purge gas is supplied into the carry-in/out region 102 through the first ejection unit 121 and the internal space of the processing container 111. However, the present disclosure is not limited thereto. A purge gas ejection device 190 (illustrated by a long and short dashed line in FIG. 2) may be provided on, for example, the wall of the housing 10 that faces the carry-in/out region 102, to eject the purge gas directly into the carry-in/out region 102. The purge gas ejection device 190 may be a fan filter unit. In this case, the purge gas ejection device 190 may have a function to take the air in a clean room where the substrate processing system 1 is provided, filter the air through a filter (e.g., a ULPA filter), and eject the filtered air into the carry-in/out region 102, in addition to the function to eject the purge gas.

The purge gas ejection device 190 may be provided at a position where the gas is not directly sprayed onto the surface (upper surface) of the substrate W supported by the lift pins 171 at the moved-up position inside the carry-in/out region 102. Then, it is possible to reduce the risk that the IPA puddle covering the upper surface of the unprocessed substrate W is adversely affected by the purge gas. As illustrated in FIG. 2, the purge gas ejection device 190 may also be provided to eject the purge gas in the horizontal direction (in the X direction) toward a region lower than the surface of the substrate W supported by the lift pins 171.

By providing the purge gas ejection device 190, the purge gas may be supplied into the carry-in/out region 102, regardless of whether the processing container 111 is opened or closed. For example, in Step 1, when the purge gas may be supplied into the carry in/out region 102 in a state where the processing container 111 is closed, the inside of the carry-in/out region 102 may reach a predetermined purge gas concentration (or predetermined humidity) in a short time. When the processing container 111 is opened, the purge gas may be supplied from the purge gas supply device into the carry-in/out region 102, and simultaneously, may be supplied from the first ejection unit 121 into the carry-in/out region 102 through the processing container 111, so that the inside of the carry-in/out region 102 may reach the predetermined gas concentration (or predetermined humidity) in a short time.

In the embodiment above, the dry gas with the low humidity is used as the purge gas. The "dry gas" indicates a gas having a lower moisture content (humidity) than that in the atmosphere (air) inside a clean room in which the substrate processing system 1 is provided. More specifically, while the embodiment above uses high-temperature nitrogen gas as the purge gas (dry gas), normal-temperature nitrogen gas may be used. However, from the viewpoint of reducing the moisture to be dissolved in the IPA puddle, the high-temperature nitrogen gas is preferable. Without being limited to nitrogen gas, the purge gas (dry gas) may be another gas with a low moisture content such as dry air. The dry air indicates air obtained by removing moisture from the air inside the clean room or its equivalent air, using a dehumidifier (known in the technical field of the manufacturing of semiconductor devices).

The substrate is not limited to a semiconductor wafer, and may be another type of substrate used in the manufacturing of semiconductor devices, such as a glass substrate and a ceramic substrate.

According to the embodiment of the present disclosure above, the level of particles of the substrate after the supercritical dry may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing container including an internal space where a supercritical drying process is performed on a substrate having a surface to which a liquid is attached, by using a processing fluid in a supercritical state;
a housing including a processing region where the processing container is disposed, and a carry-in/out region where carry-in/out of the substrate is performed;
a delivery section provided in the carry-in/out region and configured to deliver the substrate to/from a substrate transfer arm entering the carry-in/out region from an outside of the housing;
a substrate transfer section configured to transfer the substrate between the delivery section and the processing container;
a gas supply provided in the carry-in/out region to supply a dry gas to the processing container; and
a first ejection unit configured to eject the processing fluid into a lower space of the internal space toward a lower surface of the substrate,
wherein the processing fluid comprises $CO_2$, wherein the gas supply includes a gas ejector configured to eject the dry gas into the internal space of the processing container, and wherein the gas ejector is connected to a supply source of the dry gas and a supply source of the processing fluid, and includes a switch configured to make the gas ejector selectively communicate with the supply source of the dry gas or the supply source of the processing fluid.

2. The substrate processing apparatus according to claim 1, wherein the dry gas is supplied into the carry-in/out region in a manner that when the internal space communicates with the carry-in/out region, the dry gas ejected from the gas ejector into the internal space flows into the carry-in/out region while purging the internal space.

3. The substrate processing apparatus according to claim 2, further comprising:
a heater configured to heat the dry gas before the dry gas is ejected from the gas ejector into the internal space of the processing container.

4. The substrate processing apparatus according to claim 1, wherein the gas supply includes a gas ejection device having an ejection hole opened toward the carry-in/out region.

5. The substrate processing apparatus according to claim 1, wherein the delivery section includes a lift pin configured to support the substrate from below on a front end thereof and be movable up and down, and the substrate transfer section includes a tray configured to support the substrate in a horizontal posture and be movable horizontally between the carry-in/out region and the internal space of the processing container.

6. The substrate processing apparatus according to claim 2, further comprising:
a controller configured to control an overall operation of the substrate processing apparatus,
wherein within at least a portion of a time period from a time when the substrate to be subjected to the supercritical drying process in the internal space of the processing container is delivered to the delivery section until the substrate is transferred into the internal space of the processing container by the substrate transfer section, the controller stops an ejection of the dry gas from the gas ejector or reduces an ejection flow rate of the dry gas to be smaller than the ejection flow rate before the substrate is delivered to the delivery section.

7. The substrate processing apparatus according to claim 2, further comprising:

a controller configured to control an overall operation of the substrate processing apparatus, wherein when the substrate that has been subjected to the supercritical drying process in the internal space of the processing container is transferred from the internal space to the delivery section by the substrate transfer section, the controller stops an ejection of the dry gas from the gas ejector or ejects the dry gas at a first ejection flow rate during a time period until the substrate is separated from the internal space by a predetermined distance, or increases an ejection flow rate of the drying gas to a second ejection flow rate larger than the first ejection flow rate after the substrate is separated from the internal space by the predetermined distance.

8. The substrate processing apparatus according to claim 1, further comprising:

an exhaust configured to exhaust the carry-in/out region of the housing.

9. The substrate processing apparatus according to claim 8, further comprising:

a controller configured to control an overall operation of the substrate processing apparatus, wherein the controller controls the gas supply and the exhaust to make a flow rate of the dry gas supplied into the carry-in/out region by the gas supply equal to an exhaust flow rate from the exhaust.

10. The substrate processing apparatus according to claim 1, wherein the dry gas is nitrogen gas.

11. A substrate processing method comprising:

providing a substrate having a surface to which a liquid is attached, as a target to be subjected to a supercritical drying process using a substrate processing apparatus including a processing container including an internal space where the supercritical drying process is performed on the substrate, a housing including a processing region where the processing container is disposed, and a carry-in/out region where carry-in/out of the substrate is performed, a delivery section provided in the carry-in/out region and configured to deliver the substrate to/from a substrate transfer arm entering the carry-in/out region from an outside of the housing, a substrate transfer section configured to transfer the substrate between the delivery section and the processing container, and a gas supply provided in the carry-in/out region to supply a dry gas to the processing container, wherein the gas supply includes a gas ejector to eject the dry gas into the internal space of the processing container, and wherein the gas ejector is connected to a supply source of the dry gas and a supply source of the processing fluid, and includes a switch to make the gas ejector selectively communicate with the supply source of the dry gas or the supply source of the processing fluid, and a first ejection unit configured to eject the processing fluid into a lower space of the internal space toward a lower surface of the substrate, wherein the processing fluid comprises $CO_2$;

supplying the dry gas into the carry-in/out region by the gas supply, wherein supplying the dry gas includes making the gas ejector selectively communicate with the supply source of the dry gas or the supply source of the processing fluid by the switch;

after a moisture content of an atmosphere in the carry-in/out region becomes smaller than a predetermined value, carrying the substrate having the surface to which the liquid is attached, into the carry-in/out region by the substrate transfer arm, and delivering the substrate to the delivery section;

delivering the substrate from the delivery section to the substrate transfer section;

accommodating the substrate held by the substrate transfer section in the internal space of the processing container; and performing the supercritical drying process in the internal space of the processing container.

12. The substrate processing method according to claim 11, wherein the dry gas is supplied into the carry-in/out region in a manner that when the internal space communicates with the carry-in/out region, the dry gas ejected from the gas ejector into the internal space flows into the carry-in/out region while purging the internal space.

* * * * *